(12) United States Patent
Gonzalez et al.

(10) Patent No.: US 6,861,326 B2
(45) Date of Patent: Mar. 1, 2005

(54) METHODS OF FORMING SEMICONDUCTOR CIRCUITRY

(75) Inventors: Fernando Gonzalez, Boise, ID (US); Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 09/989,931

(22) Filed: Nov. 21, 2001

(65) Prior Publication Data

US 2003/0094641 A1 May 22, 2003

(51) Int. Cl.[7] .............................................. H01L 21/331
(52) U.S. Cl. .................... 438/361; 438/162; 438/480; 438/517; 438/933; 257/347; 257/505; 257/520
(58) Field of Search ................................ 438/758–760, 438/763, 933, 974–976, 942, 162, 517, 360–361, 479–481; 257/505, 520, 347, 618

(56) References Cited

U.S. PATENT DOCUMENTS

| | | | | |
|---|---|---|---|---|
| 5,759,908 A | * | 6/1998 | Steckl et al. | 438/479 |
| 5,891,769 A | * | 4/1999 | Liaw et al. | 438/167 |
| 5,999,675 A | * | 12/1999 | Sugiyama | 385/49 |
| 6,358,806 B1 | * | 3/2002 | Puchner | 438/308 |
| 6,462,381 B1 | * | 10/2002 | Beebe et al. | 257/355 |
| 6,544,854 B1 | * | 4/2003 | Puchner et al. | 438/308 |
| 6,555,891 B1 | * | 4/2003 | Furukawa et al. | 257/505 |
| 6,620,671 B1 | * | 9/2003 | Wang et al. | 438/226 |
| 2001/0008292 A1 | | 7/2001 | Leobandung et al. | |
| 2001/0045604 A1 | | 11/2001 | Oda et al. | |
| 2002/0019105 A1 | | 2/2002 | Hattori et al. | |
| 2002/0086557 A1 | * | 7/2002 | Matsumura et al. | 438/788 |
| 2002/0182423 A1 | * | 12/2002 | Chu et al. | 428/446 |
| 2003/0062586 A1 | * | 4/2003 | Wallace et al. | 257/506 |

FOREIGN PATENT DOCUMENTS

| | | | | |
|---|---|---|---|---|
| JP | 10270746 A | * | 10/1998 | H01L/31/107 |
| JP | 11177122 A | * | 7/1999 | H01L/31/10 |

* cited by examiner

Primary Examiner—Tom Thomas
Assistant Examiner—José R. Diaz
(74) Attorney, Agent, or Firm—Wells St. John P.S.

(57) ABSTRACT

The invention includes a method of forming semiconductor circuitry. A monocrystalline silicon substrate is provided, and a mask is formed which covers a first portion of the substrate and leaves a second portion uncovered. A trench is formed in the uncovered portion and at least partially filled with a semiconductive material that comprises at least one atomic percent of an element other than silicon. The mask is removed and a first semiconductor circuit component is formed over the first portion of the substrate. Also, a second semiconductor circuit component is formed over the semiconductive material that at least partially fills the trench. The invention also includes semiconductor constructions.

14 Claims, 5 Drawing Sheets

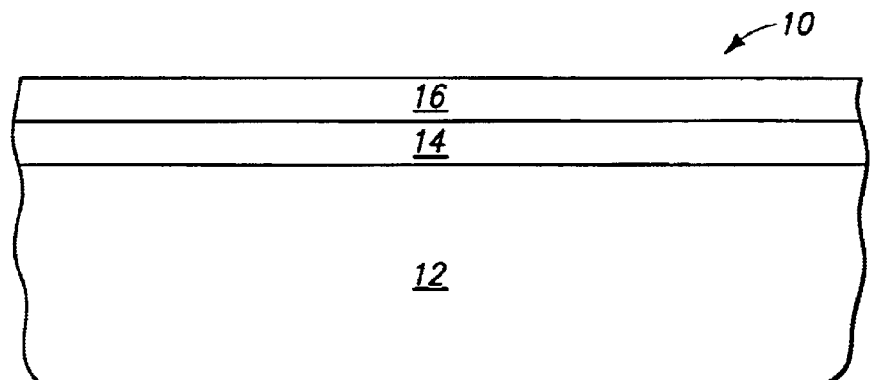
_FIG. 1_
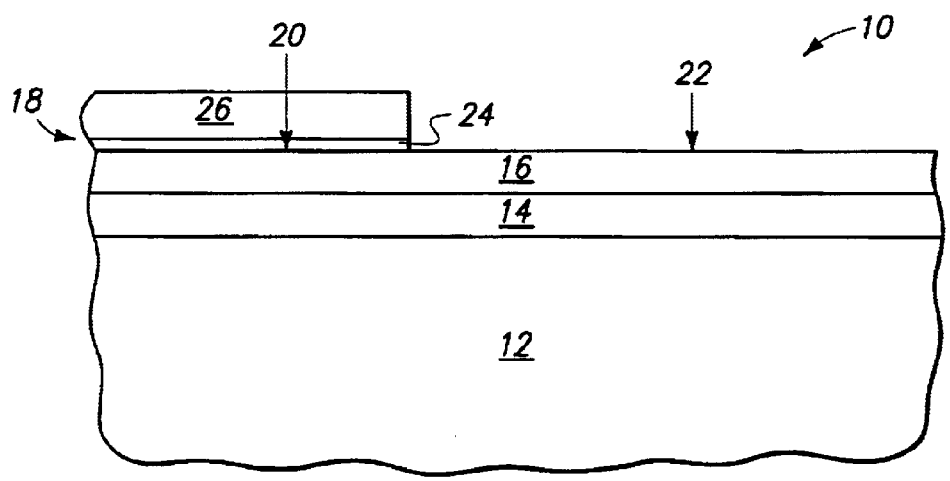
_FIG. 2_
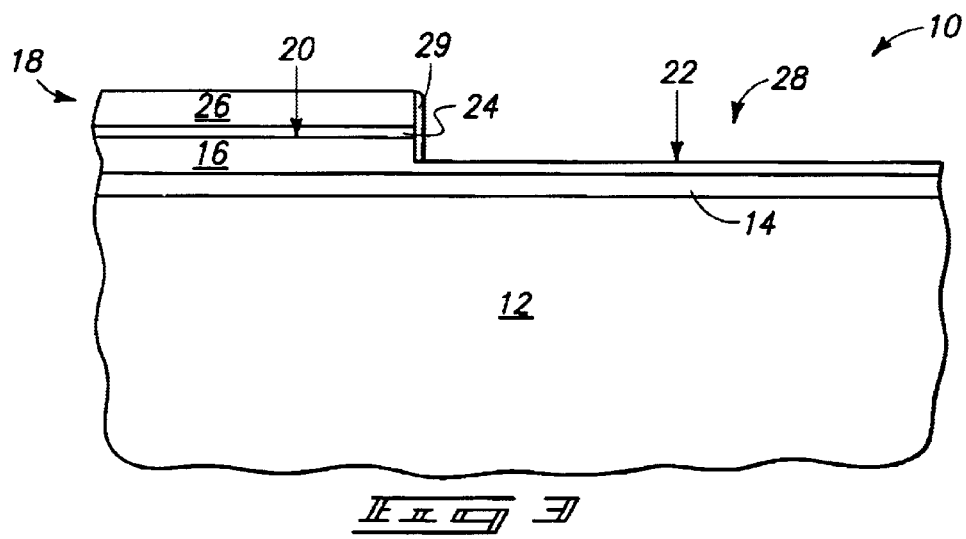
_FIG. 3_

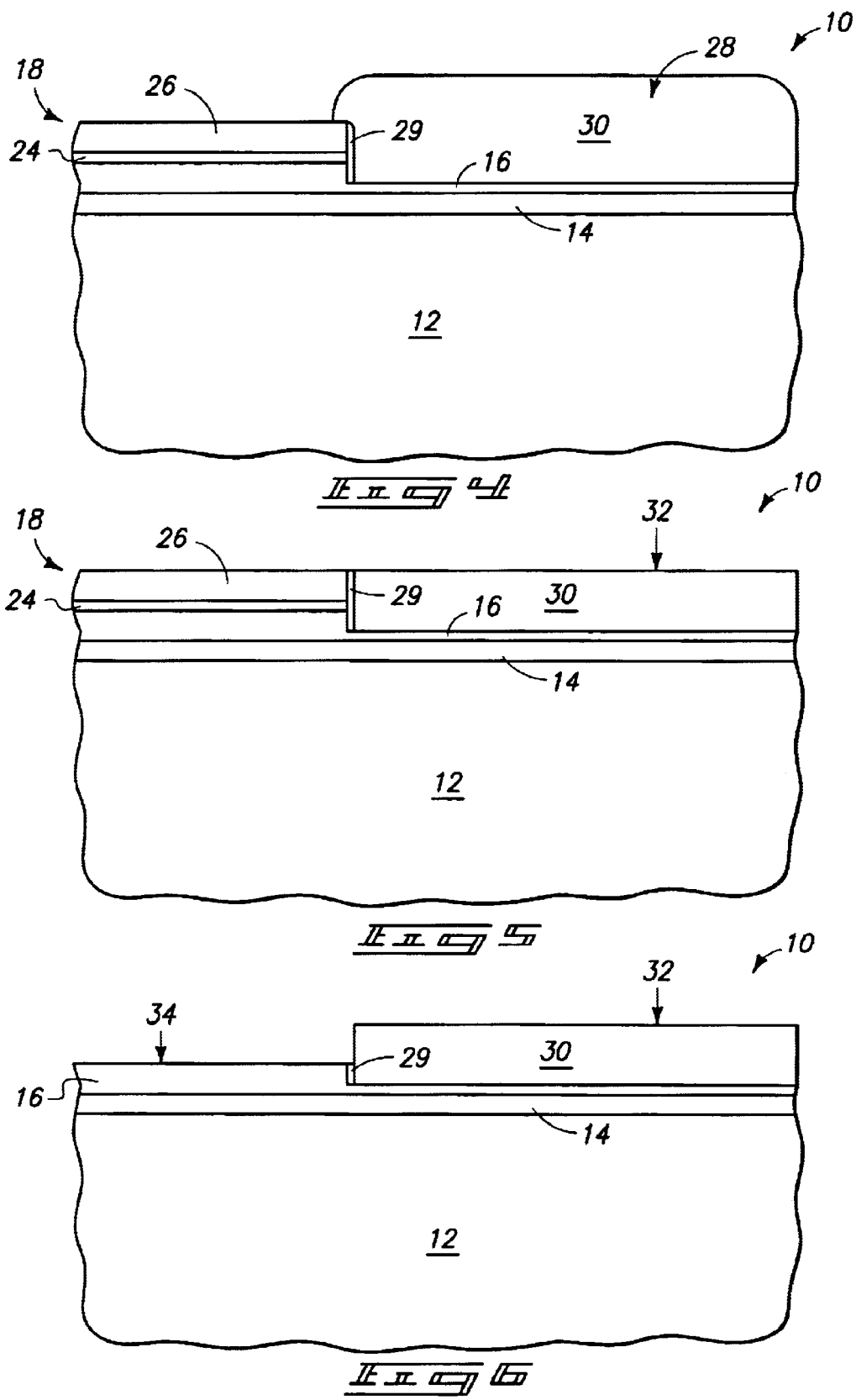

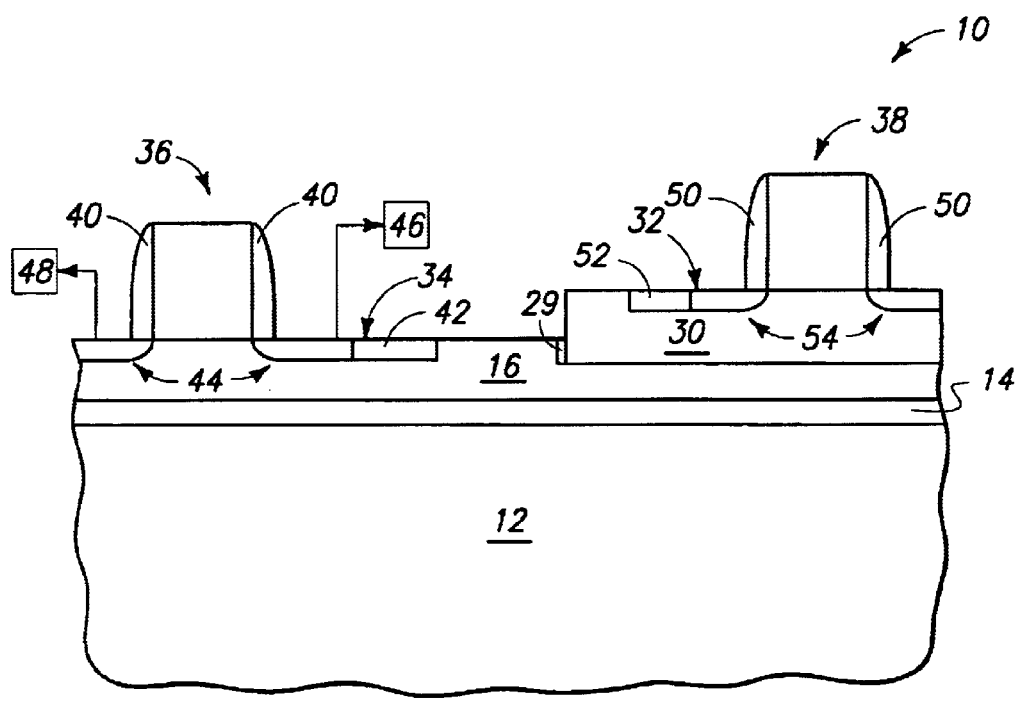
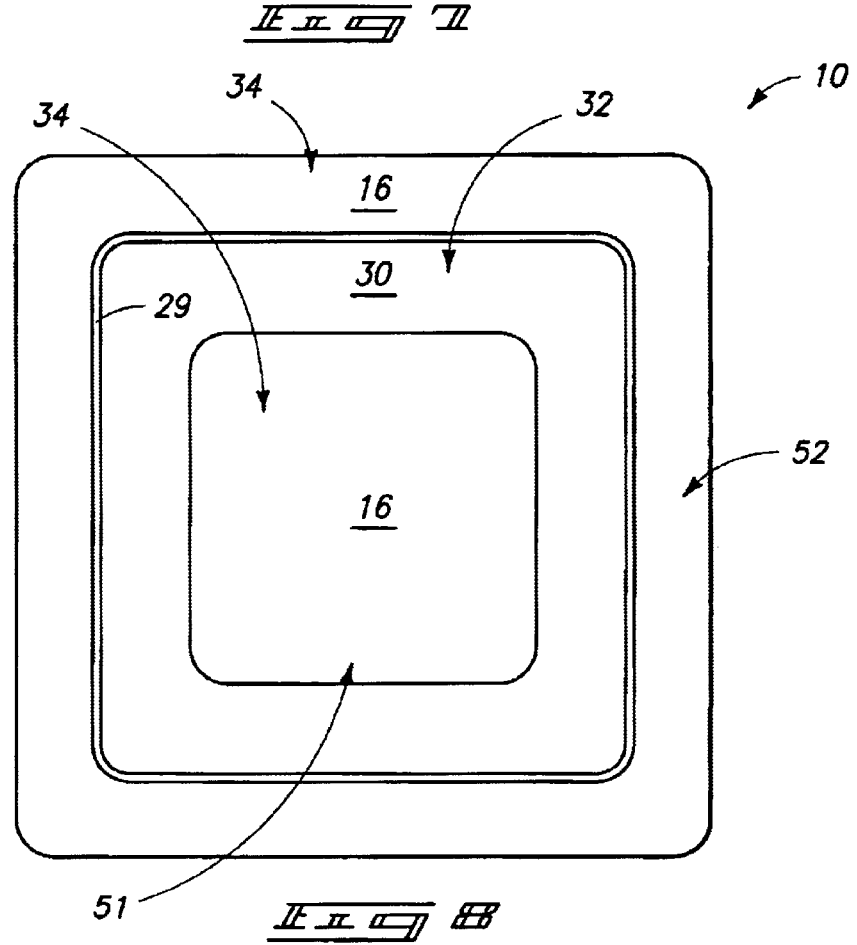

US 6,861,326 B2

METHODS OF FORMING SEMICONDUCTOR CIRCUITRY

TECHNICAL FIELD

The invention pertains to methods of forming semiconductor circuitry, and in particular applications encompasses methods wherein a mixed semiconductive material substrate is formed. One portion of the mixed semiconductive material substrate can comprise, for example, monocrystalline silicon, and another portion can comprise a semiconductive material that includes at least one atomic percent of an element other than silicon. The invention also pertains to semiconductor constructions.

BACKGROUND OF THE INVENTION

Integrated circuit constructions typically comprise a semiconductive material substrate having circuitry formed thereover. The circuitry can fall within different classes of circuit types, with one exemplary class being memory devices, and another exemplary class being logic devices. For instance, memory chips will frequently comprise an array of memory devices, and will further comprise logic devices peripheral to the memory array. Exemplary memory devices are dynamic random access memory (DRAM) devices.

The memory devices and logic devices can have different desired operating parameters relative to one another. For instance, a highly desired aspect of memory devices can be that such devices have very low off current. In other words it can be desired that very little, if any, current trickle through the devices in an off state. In contrast, peripheral devices can frequently tolerate a higher off current than memory devices, but it can be desired that the peripheral devices have enhanced mobility of charge within semiconductive substrates incorporated into the devices.

It can be difficult to incorporate memory devices and logic devices into a single integrated circuit while optimizing performance parameters of both the memory devices and logic devices. It would therefore be desirable to develop new methods of forming semiconductor circuitry which could enable optimization of memory device parameters and logic device parameters when the memory devices and logic devices are incorporated into a common integrated circuit construction.

SUMMARY OF THE INVENTION

In one aspect, the invention encompasses a method of forming semiconductor circuitry. A monocrystalline silicon substrate is provided, and a mask is formed which covers a first portion of the substrate and leaves a second portion uncovered. A trench is formed in the uncovered portion and at least partially filled with a semiconductive material that comprises at least one atomic percent of an element other than silicon. The mask is removed and a first semiconductor circuit component is formed over the first portion of the substrate. Also, a second semiconductor circuit component is formed over the semiconductive material that at least partially fills the trench.

In another aspect, the invention encompasses a semiconductor construction. The construction includes a bulk semiconductive material structure, and an insulative material over the bulk semiconductive material structure. A mass of semiconductive material is over a first portion of the insulative material and not over a second portion of the insulative material. The semiconductive material of the mass comprises at least one atomic percent of an element other than silicon. A monocrystalline silicon layer is formed over the second portion of the insulative material.

BRIEF DESCRIPTION OF THE DRAWINGS

Preferred embodiments of the invention are described below with reference to the following accompanying drawings.

FIG. 1 is a diagrammatic, cross-sectional, fragmentary view of a semiconductor construction shown at a preliminary processing step of a method of the present invention.

FIG. 2 is a view of the FIG. 1 fragment shown at a processing step subsequent to that of FIG. 1.

FIG. 3 is a view of the FIG. 1 fragment shown at a processing step subsequent to that of FIG. 2.

FIG. 4 is a view of the FIG. 1 fragment shown at a processing step subsequent to that of FIG. 3.

FIG. 5 is a view of the FIG. 1 fragment shown at a processing step subsequent to that of FIG. 4.

FIG. 6 is a view of the FIG. 1 fragment shown at a processing step subsequent to that of FIG. 5.

FIG. 7 is a view of the FIG. 1 fragment shown at a processing step subsequent to that of FIG. 6.

FIG. 8 is a top view of a semiconductor construction illustrating a zoning aspect of the present invention.

DETAILED DESCRIPTION OF THE PREFERRED EMBODIMENTS

Figure 9:
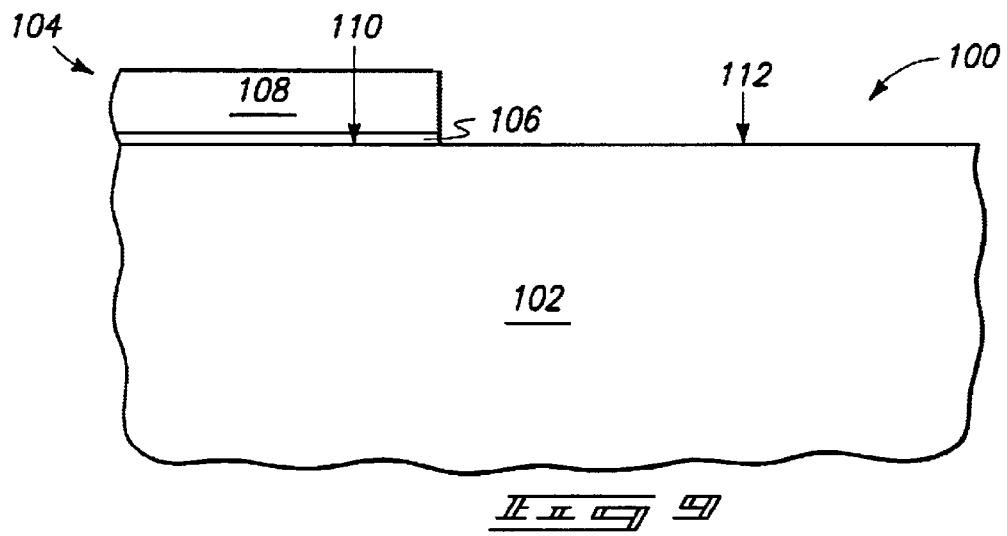
FIG. 9 is a diagrammatic, cross-sectional, fragmentary view of a semiconductor construction at a preliminary processing step of a second embodiment method of the present invention.

A first embodiment of the present invention is described with reference to FIGS. 1–7. Referring initially to FIG. 1, a semiconductor construction 10 comprises a substrate 12 having an insulative material 14 thereover. Substrate 12 can comprise semiconductive material and can be referred to as a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Monocrystalline material 12 can comprise, consist essentially of, or consist of, silicon.

Insulative material 14 can comprise, for example, silicon dioxide. In particular embodiments, insulative material 14 can consist essentially of, or consist of, silicon dioxide.

A monocrystalline semiconductive material layer 16 is over insulative material 14. Monocrystalline material 16 can comprise, consist essentially of, or consist of, silicon; or can comprise, consist essentially of, or consist of, doped silicon. The construction 10 can be referred to as a silicon on insulator assembly.

The construction of FIG. 1 can be formed by numerous methods. For instance, the construction of FIG. 1 can be formed by providing a single bulk monocrystalline material and subsequently implanting oxide into the material to form the layer 14. The implanted layer 14 separates the initial bulk monocrystalline material into regions 12 and 16 which are spaced from one another by the implanted oxide region 14. Another exemplary process for forming the construction of FIG. 1 is to provide a first substrate which comprises monocrystalline material 12 and a portion of oxide layer 14, and to provide a second substrate which comprises monocrystalline material 16 and another portion of oxide layer 14. The first and second substrates can then be joined to one another by annealing the portion of oxide layer 14 from the first substrate to the portion of oxide layer 14 of the second substrate. Further, the second substrate can have a damage region therein, which is subsequently broken to form layer 16 to a desired thickness. The utilization of a damage region to form a monocrystalline material to a desired thickness is frequently referred to as "smart cut" technology.

Although the shown embodiment has a first monocrystalline material 12 spaced from a second monocrystalline material 16 by insulative layer 14, it is to be understood that other materials could be provided between monocrystalline materials 12 and 16 in addition to insulative material 14. Accordingly it can be preferred that monocrystalline materials 12 and 16 are spaced from one another by at least insulative material 14, but not necessarily by only insulative material 14. Also, it is to be understood that the invention encompasses embodiments wherein monocrystalline materials 12 and 16 are spaced from one another by an electrically conductive material in addition to, or alternatively to, electrically insulative material 14.

Referring to FIG. 2, a mask 18 is formed over a first segment 20 of monocrystalline material 16, while leaving another segment 22 of monocrystalline material 16 uncovered. In the shown embodiment, mask 18 comprises a first portion 24 of silicon dioxide, and a second portion 26 of silicon nitride. In particular embodiments, layer 26 can consist essentially of, or consist of, silicon nitride; and layer 24 can consist essentially of, or consist of, silicon dioxide.

Silicon dioxide portion 24 is provided as a pad to alleviate stress which could otherwise be formed between silicon nitride layer 26 and monocrystalline semiconductive material 22. Mask 18 can be formed by, for example, photolithographic processing. Specifically, materials 24 and 26 can be initially formed over an entirety of semiconductive material 16, and subsequently a patterned photoresist material (not shown) can be formed over a portion of mask 18 with photolithographic methods. Subsequently, an uncovered portion of mask 18 can be removed with suitable etching. The photoresist can then be stripped to leave the resulting mask structure shown in FIG. 2.

Referring to FIG. 3, semiconductive material 16 is exposed to a suitable etch to form a recess 28 in the uncovered portion 22 of material 16. During such etch, mask 18 protects the covered portion 20 of monocrystalline material 16 from being removed. If monocrystalline material 16 comprises silicon, a suitable etch can be an anisotropic etch comprising one or more of $CF_4$, $CF_3$, Cl, $SF_6$, $Cl_2$, and $O_2$. In the shown embodiment, recess 28 extends only partially into semiconductive material 16, and accordingly does not expose the electrically insulative material 14 underlying semiconductive material 16. It is to be understood, however, that the invention encompasses other embodiments (not shown) wherein the etch removes an entirety of the uncovered portion 22 of semiconductor material 16, and accordingly exposes an upper surface of electrically insulative material 14. Further, the invention encompasses applications in which the etch removes an entirety of the uncovered portion 22 of semiconductor material 16, and penetrates through insulative material 14 to expose an upper surface of semiconductive material 12. It can be preferred to have a bottom portion of recess 28 comprising silicon in applications in which it is ultimately desired to form silicon/germanium within the recess. Recess 28 can have a configuration of, for example, a trench.

FIG. 3 illustrates an optional spacer 29 formed along a sidewall periphery of recess 28. Specifically, spacer 29 is formed along sidewall edges of layers 24 and 26, as well as along an exposed edge of semiconductive material 16 extending within recess 28. Spacer 29 can comprise, consist essentially of, or consist of, for example, silicon nitride and/or silicon dioxide; and can be formed by deposition of an appropriate material followed by an anisotropic etch of the material.

Referring to FIG. 4, recess 28 is at least partially filled with a material 30 which is preferably a semiconductive material. In the shown embodiment, recess 28 is entirely filled with semiconductive material 30. It is preferred that semiconductive material 30 comprise at least 1% of an element different than that predominantly comprised by semiconductive mass 16. In particular embodiments mass 16 consists essentially of, or consists of, monocrystalline silicon, and it is preferred that semiconductive material 30 comprise at least one atomic percent of an element other than silicon. For instance, semiconductive material 30 can comprise silicon and germanium, with the germanium being present to an atomic concentration of from about 1% to about 20%; can consist essentially of the silicon and germanium; or can consist of the silicon and germanium. In other embodiments, semiconductive material 16 can comprise, consist essentially of, or consist of monocrystalline silicon, and semiconductive material 30 can comprise, consist essentially of, or consist of a III/V compound semiconductive material, such as, for example, Ga/As, Ga/P, In/P, and In/As. In yet other embodiments, mass 30 can comprise, consist essentially of, or consist of, silicon and carbon. An exemplary material which comprises silicon and carbon is silicon carbide. The silicon/carbon material preferably comprises at least about 1 atomic percent carbon.

In a particular embodiment, mass 30 comprises silicon/germanium, and mass 16 comprises monocrystalline silicon. A reason for leaving the shown narrow amount of silicon layer 16 over insulative layer 14 within recess 28 is to provide a seed layer for subsequent growth of silicon/germanium. The silicon/germanium can be grown as, for example, an epitaxial layer. Exemplary conditions for growing silicon/germanium over a silicon seed layer include a temperature of from about 600° C. to about 900° C., a pressure of from about 1 Torr to about 100 Torr, and utilization of one or more of $SiH_4$, $SiH_2Cl_2$, HCl, and $H_2$.

Referring to FIG. 5, construction 10 is subjected to planarization, such as, for example, chemical-mechanical polishing, to form a planarized upper surface 32 which extends across semiconductive material 30 and layer 26. In particular embodiments, semiconductive material 30 will comprise, consist essentially of, or consist of silicon and germanium, with the germanium being provided to a concentration of from about one atomic percent to about 20 atomic percent. In such embodiments it can be desirable to expose material 30 to an anneal to recrystallize material 30, and thereby improve electron mobility and other physical characteristics of material 30, such as, for example reducing the number of dislocations present within the material. A suitable anneal can be accomplished by exposing material 30 to a temperature of from about 800° C. to about 1,100° C. for a time of from about 20 seconds to about five minutes, while also exposing material 30 to a laser generating an appropriate wavelength of light so that energy from the laser is absorbed by silicon/germanium material 30. The anneal of material 30 preferably occurs after the planarization of the upper surface of material 30, but can, in other embodiments, occur before such planarization.

Referring to FIG. 6, mask 18 (FIG. 5) is removed. Such removal can be accomplished with an etch selective for the material of mask 18 relative to that of semiconductive material 30. Alternatively, or in addition, the removal can be accomplished by forming a protective mask (not shown) over material 30 to protect material 30 from etching conditions while exposing the material of mask 18 to an etch which removes mask 18. The etching to remove mask 18 can, as shown, remove at least a portion of spacer 29. In the shown embodiment, the etching has removed only a portion of spacer 29, while leaving another portion to separate a sidewall of material 30 from a sidewall of the material 16 proximate material 30. The shown remaining portion of spacer 29 can advantageously inhibit or prevent lateral exchange of components between materials 16 and 30.

After the removal of mask 18, semiconductive material 30 retains planarized upper surface 32, and semiconductive material 16 has an upper surface 34 which is elevationally below planarized upper surface 32. A distance between upper surface 32 and upper surface 34 is preferably less than or equal to about 200 Å so that subsequent photolithographic processing across construction 10 is not adversely impacted by an elevational difference between surfaces 32 and 34. In an exemplary embodiment, an elevational difference between surfaces 32 and 34 is from about 50 Å to about 200 Å.

The shown construction can be considered to comprise a bulk semiconductive material structure 12 having an insulative material 14 thereover. Mass 30 corresponds to a mass of semiconductor material which is over a first portion of the insulative material and not over a second portion of the insulative material. The monocrystalline material 16 corresponds to a layer which is over the second portion of the insulative material. In the shown embodiment, monocrystalline material 16 further comprises a segment which extends over the first portion of the insulative material, and which is between mass 30 and the first portion of the insulative material. It is to be understood, however, that the invention encompasses other embodiments (not shown) wherein mass 30 directly physically contacts insulative material 14.

Referring to FIG. 7, a first semiconductor circuit component 36 is formed over surface 34 of monocrystalline semiconductive material 16, and a second semiconductor circuit component 38 is formed over surface 32 of semiconductive material 30.

First semiconductor circuit component 36 comprises a transistor gate, and can comprise, for example, various layers of insulative material, conductively doped silicon, silicide, and/or conductive metal layers, as would be utilized in conventional transistor gate constructions. Sidewall spacers 40 are shown formed along sidewalls of transistor gate 36, and such spacers would typically comprise silicon nitride, silicon dioxide, and/or other electrically insulative materials. An isolation region 42 is shown formed within monocrystalline semiconductive material 16. Isolation region 42 can comprise, for example, silicon dioxide, and can correspond to a shallow trench isolation region. Source/drain regions 44 are shown extending within monocrystalline semiconductor material 16. One of the source/drain regions can be electrically connected to a capacitor construction 46, and the other can be electrically connected to a bit line 48. Accordingly, transistor construction 36 can be incorporated into a DRAM cell.

Transistor gate 38 can comprise similar components as does transistor gate 36, or different components. Transistor gates 36 and 38 will generally comprises stacks of gate oxide (typically silicon dioxide), conductively-doped silicon, and metal silicide. The gate oxide thickness utilized in gate 36 can be different than that utilized in gate 38. Also, the type of conductivity-enhancing dopant utilized in silicon of gate 36 can be different than that utilized in silicon of gate 38.

Sidewall spacers 50 are shown formed along sidewalls of transistor gate 38. An isolation region 52 is shown formed within semiconductor material 30, and such isolation region can correspond to, for example, a shallow trench isolation region. Source/drain regions 54 are shown extending within material 30, and adjacent transistor gate 38. Transistor gate 38 can be incorporated into, for example, logic circuitry.

FIG. 8 is a top view of semiconductor construction 10, and diagrammatically illustrates a zonal configuration of one embodiment of the present invention. The construction of FIG. 8 is shown at a processing step corresponding to that of FIG. 6. Semiconductive material mass 30 extends around an exposed portion 51 of monocrystalline material 16. In other words, upper surface 32 of mass 30 encircles the exposed portion 51 of monocrystalline mass 16. Another exposed portion 52 of mass 16 is shown outwardly of mass 30 relative to the encircled exposed portion 51. The first semiconductor circuit component 36 of FIG. 7 can correspond to a portion of a DRAM array, and such DRAM array can be formed in the encircled exposed portion 51 of monocrystalline mass 16. The second semiconductor circuit component 38 can correspond to a portion of circuitry formed peripheral to the DRAM array, and in the shown embodiment can correspond to a portion of circuitry which encircles the DRAM array. The memory array can be entirely over the exposed portion of monocrystalline material 16, and accordingly not over mass 30. In other words, the invention encompasses embodiments wherein no DRAM cells are formed over mass 30, but instead an entirety of the DRAM cells of an integrated circuit construction are over the exposed monocrystalline material 16.

A second embodiment of the invention is described with reference to FIGS. 9–13. Referring initially to FIG. 9, a semiconductor construction 100 is illustrated at a preliminary processing step. Construction 100 comprises a substrate 102, and a patterned mask 104 over the substrate. Substrate 102 can comprise, for example, a monocrystalline semiconductive material, such as monocrystalline silicon. Mask 104 can comprise a layer 106 of silicon dioxide and a layer 108 of silicon nitride. Mask 104 can be formed utilizing methodology similar to that described above with reference to FIG. 2 for forming mask 18. Mask 104 covers a portion 110 of substrate 102, while leaving another portion 112 not covered.

Figure 10:
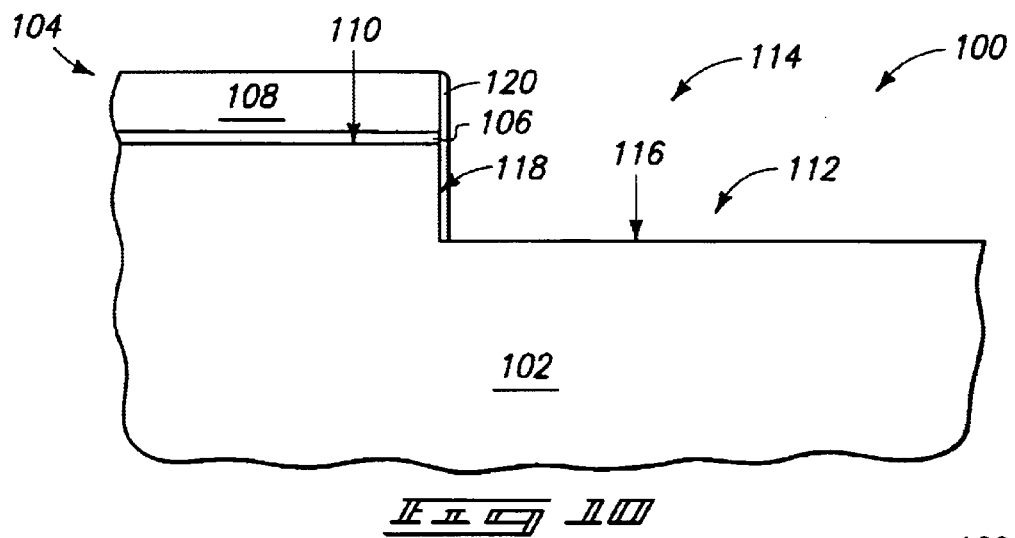
FIG. 10 is a view of the FIG. 9 fragment shown at a processing step subsequent to that of FIG. 9.

Referring to FIG. 10, a recess 114 is etched into uncovered portion 112, while mask 104 protects covered portion 110. In embodiments in which substrate 102 comprises monocrystalline silicon, recess 114 can be formed by, for example, etching with one or more of $CF_4$, $O_2$, $CF_3$, Cl, $SF_6$, and $Cl_2$. Recess 114 is preferably formed to a depth of from about 0.1 microns to about 10 microns.

Recess 114 comprises a bottom surface 116 and a sidewall surface 118. In the shown embodiment, an optional spacer 120 is formed across the sidewall surfaces. Spacer 120 can comprise an insulative material 120 such as, for example, silicon dioxide or silicon nitride. In particular embodiments (not shown), spacer 120 can extend across bottom surface 116 of recess 114. Insulative material of spacer 120 can be formed by, for example, deposition of appropriate materials and subsequent etching. Instead of, or in addition to, deposition, thermal oxidation can be utilized to form material 120 in applications in which material 120 comprises silicon dioxide.

Figure 11:
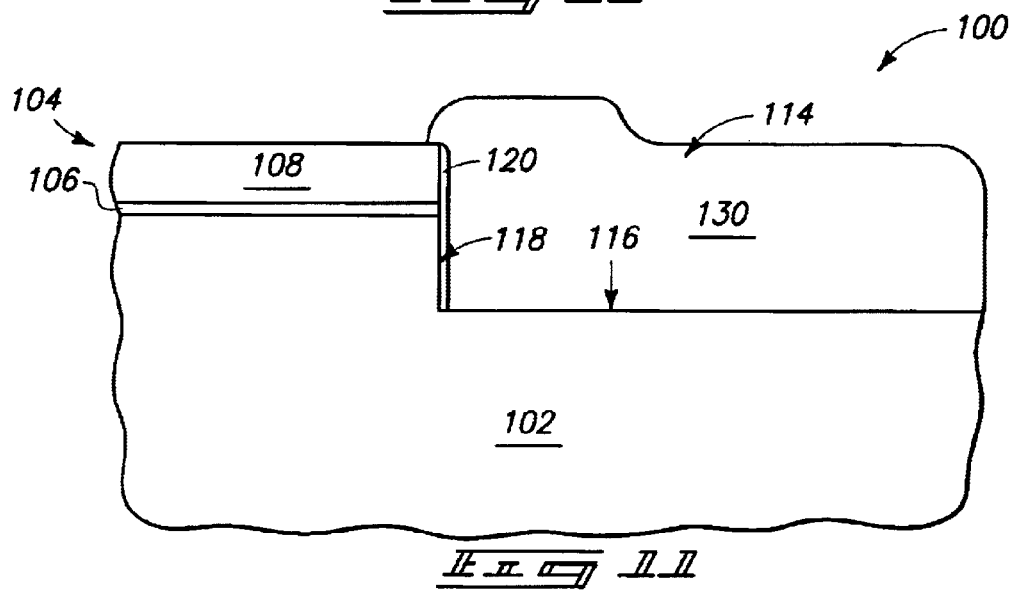
FIG. 11 is a view of the FIG. 9 fragment shown at a processing step subsequent to that of FIG. 10.

Referring to FIG. 11, a mass 130 of semiconductive material is formed within recess 114. Mass 130 can comprise, for example, the same materials as discussed above with reference to mass 30 of FIG. 4. An advantage of providing spacer 120 is that such can form a barrier between mass 130 and semiconductive material 102 to alleviate or prevent lateral cross-diffusion of components between mass 130 and monocrystalline material 102. It is to be understood, however, that the invention encompasses other embodiments wherein spacer 120 is eliminated. Further, it is to be understood that the invention encompasses embodiments wherein other barrier layers in addition to, or alternatively to, spacer 120 are utilized as a barrier along some or all of an interface between monocrystalline material 102 and semiconductive mass 130.

Figure 12:
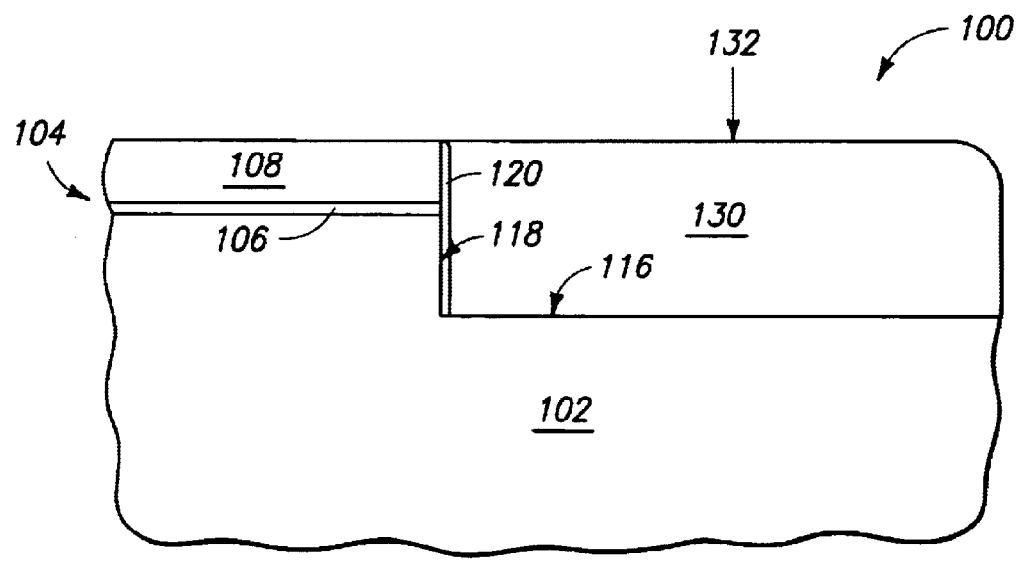
FIG. 12 is a view of the FIG. 9 fragment shown at a processing step subsequent to that of FIG. 11.

Referring to FIG. 12, construction 100 is subjected to planarization, such as, for example, chemical-mechanical polishing, to form a planarized upper surface 132 which extends across mass 130 and layer 108 of mask 104. Mass 130 can be subjected to annealing, similar to that discussed above with reference to mass 30, either before or after the planarization of an upper surface of mass 130.

Figure 13:
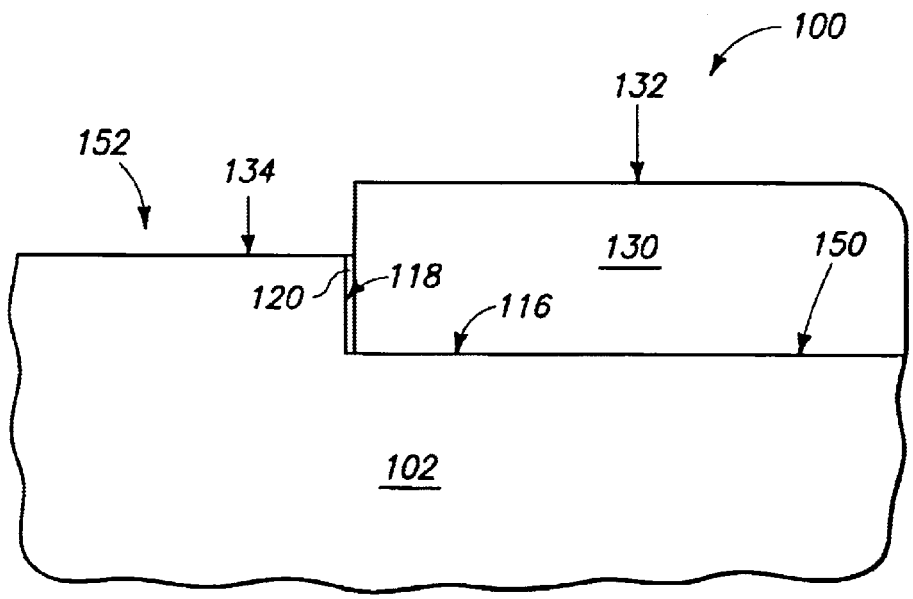
FIG. 13 is a view of the FIG. 9 fragment shown at a processing step subsequent to that of FIG. 12.

Referring to FIG. 13, mask 104 (FIG. 12) is removed to leave an exposed portion 134 of monocrystalline material 102. Exposed portion 134 comprises an uppermost surface of monocrystalline material 102, and such is elevationally below the uppermost surface 132 of mass 130. A difference in elevation between surfaces 132 and 134 is preferably less than 200 Å, and can be, for example, from about 50 Å to about 200 Å for reasons similar to those discussed with reference to FIG. 6 regarding the difference in elevation between surfaces 32 and 34.

The construction of FIG. 13 can be alternatively described as a monocrystalline bulk substrate 102 having a semiconductive material mass 130 over a first portion 150, and not over a second portion 152. Mass 130 preferably comprises a semiconductive material different from the semiconductive material of monocrystalline bulk substrate 102. More specifically, if monocrystalline bulk substrate 102 consists essentially of a particular element, such as, for example, silicon, semiconductive material 130 will preferably comprise at least one atomic percent of an element different from that of bulk substrate 102.

Further processing can be performed to form semiconductor circuitry over and/or within semiconductive material 130 and monocrystalline material 102, similar to the processing described above with reference to FIGS. 7 and 8.

It is noted that it can be advantageous to round the edges and upper corners of masses 30 (FIG. 6) and 130 (FIG. 13) having abrupt ridges occurring in layers (not shown) that are formed to extend across the edges of masses 30 and 130. The edges and upper corners of masses 30 and 130 can be rounded by, for example, oxidation in particular aspects of the present invention which are not shown.

Among the advantages of methodology of the present invention relative to prior art methodology is that the invention can allow improved speed of DRAM and logic circuit constructions. For example, the present invention can enable improved speed of transistors associated with DRAM circuitry, as well as improved speed of transistors associated with logic circuitry. Specifically the invention can enable the substrate of the peripheral circuitry to be tailored to meet the needs of the peripheral circuitry, and yet also enable the substrate of the DRAM array circuitry to be tailored to meet the needs of the DRAM circuitry. In particular embodiments, the present invention can enable relatively fast DRAM without sacrificing refresh speed and quality. Additionally, the invention can be incorporated into existing fabrication technologies with relatively little expense.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming semiconductor circuitry, comprising:

providing a substrate comprising a first monocrystalline material, an insulative layer over the first monocrystalline material, and a second monocrystalline material over the insulative layer and spaced from the first monocrystalline material by at least the insulative layer; the second monocrystalline material consisting essentially of a first element;

forming a mask to cover a first portion of the second monocrystalline material while leaving a second portion uncovered;

removing at least some of the uncovered portion to form a recess;

after forming the recess, forming an insulative material spacer along a sidewall of the recess;

after forming the insulative material spacer, entirely filling the recess with a semiconductive material comprising at least 1 atomic percent of an element other than the first element, the semiconductive material consisting essentially of Si and Ge, with the Ge being present to an atomic concentration of from about 1% to about 20%, the semiconductive material being formed along the insulative material spacer;

chemical-mechanical polishing the semiconductive material to form a planarized surface which extends across the semiconductive material and mask;

after the chemical-mechanical polishing, exposing the semiconductive material to a laser to anneal the Si and Ge of the semiconductive material;

removing the mask after the anneal;

after removing the mask, forming a first semiconductor circuit component over the first portion of the second monocrystalline material; and forming a second semiconductor circuit component over the semiconductive material.

2. The method of claim 1 wherein the first and second monocrystalline materials consist essentially of silicon.

3. The method of claim 1 wherein the first and second monocrystalline materials consist essentially of silicon, and wherein the insulative layer consists essentially of silicon dioxide.

4. The method of claim 1 wherein the mask comprises a layer consisting essentially of silicon nitride over a layer consisting essentially of silicon dioxide.

5. The method of claim 1 wherein the anneal comprises maintaining the semiconductive material at a temperature of from about 800° C. to about 1100° C. for a time of from about 20 seconds to about 5 minutes.

6. The method of claim 1 wherein, after the removal of the mask, the semiconductive material extends above an uppermost surface of the first portion of the second monocrystalline substrate by a distance of from about 50 Å to about 200 Å.

7. The method of claim 1 wherein the first element is silicon.

8. The method of claim 1 wherein the recess extends entirely through the second monocrystalline material.

9. The method of claim 8 wherein the recess extends into the insulative layer.

10. The method of claim 1 wherein the recess extends entirely through the second monocrystalline material and entirely through the insulative layer.

11. A method of forming semiconductor circuitry, comprising:

providing a substrate comprising a first monocrystalline material, an insulative layer over the first monocrystalline material, and a second monocrystalline material over the insulative layer and spaced from the first monocrystalline material by at least the insulative layer; the second monocrystalline material consisting essentially of silicon;

forming a mask to cover a first portion of the second monocrystalline material while leaving a second portion uncovered;

removing at least some of the uncovered portion to form a recess;

after forming the recess, forming an insulative material spacer along a sidewall of the recess;

after forming the insulative material spacer, entirely filling the recess with a semiconductive material comprising at least 1 atomic percent of an element other than the silicon, the semiconductive material being formed along the insulative material spacer;

chemical-mechanical polishing the semiconductive material to form a planarized surface which extends across the semiconductive material and mask;

removing the mask;

after removing the mask, forming a first semiconductor circuit component over the first portion of the second monocrystalline material and forming a second semiconductor circuit component over the semiconductive material.

12. The method of claim 11 wherein the semiconductive material consists essentially of silicon and germanium.

13. The method of claim 11 wherein the semiconductive material consists essentially of silicon and carbon.

14. The method of claim 11 wherein the semiconductive material consists essentially of a II/V compound.

* * * * *

UNITED STATES PATENT AND TRADEMARK OFFICE
CERTIFICATE OF CORRECTION

PATENT NO. : 6,861,326 B2  
APPLICATION NO. : 09/989931  
DATED : March 1, 2005  
INVENTOR(S) : Gonzalez et al.

Page 1 of 1

It is certified that error appears in the above-identified patent and that said Letters Patent is hereby corrected as shown below:

Title Page, Item (56), "References Cited", "U.S. PATENT DOCUMENTS",
Insert --4,903,108   2/1990   Young et al.
5,650,343   7/1997   Luning et al.--
Before "5,759,908".

Title Page, Item (56), "References Cited", "U.S. PATENT DOCUMENTS",
Insert --6,306,691 B1   10/2001   Koh--
Before "6,358,806 B1".

Title Page, Item (56), "References Cited", "U.S. PATENT DOCUMENTS",
Insert --6,566,210 B2   5/2003   Ajmera et al.--
Before "6,620,671 B1".

Title Page, Item (56), "References Cited", "U.S. PATENT DOCUMENTS",
Insert --6,653,714 B2   11/2003   Matsuno et al.--
Before "2001/0008292 A1".

Title Page, Item (56), "References Cited",
Insert --OTHER PUBLICATIONS
Lee, W. et al., "Investigation of Poly-$Si_{1-x}Ge_x$ for Dual-Gate CMOS Technology", IEEE Electron Device Letters, Vol. 19, No. 7, July 1998, pp. 247-249.
Wolf, S., "Silicon Processing for the VLSI Era: Vol. 1: Process Technology", 1986 Lattice Press, pp. 191-195.
Before "* cited by examiner".

Signed and Sealed this

First Day of August, 2006

JON W. DUDAS  
*Director of the United States Patent and Trademark Office*